(12) United States Patent  (10) Patent No.: US 7,411,518 B2
Ratnakar  (45) Date of Patent: Aug. 12, 2008

(54) PARKING LOCATION REMINDER DEVICE

(75) Inventor: Nitesh Ratnakar, Oak Creek, WI (US)

(73) Assignee: Novation Science, LLC, Elkins, WV (US)

(*) Notice: Subject to any disclaimer, the term of this patent is extended or adjusted under 35 U.S.C. 154(b) by 141 days.

(21) Appl. No.: 11/307,405

(22) Filed: Feb. 6, 2006

(65) Prior Publication Data
US 2006/0103542 A1    May 18, 2006

(51) Int. Cl.
B60Q 1/48 (2006.01)
(52) U.S. Cl. ............... 340/932.2; 340/988; 340/996
(58) Field of Classification Search ........... 340/932.2
See application file for complete search history.

(56) References Cited

U.S. PATENT DOCUMENTS

| | | | |
|---|---|---|---|
| D370,339 S * | 6/1996 | Pinchuk | D3/208 |
| 5,602,963 A * | 2/1997 | Bissonnette et al. | 704/275 |
| 5,903,871 A * | 5/1999 | Terui et al. | 704/500 |
| 6,114,953 A * | 9/2000 | Martin | 340/457 |
| 6,160,319 A * | 12/2000 | Marougi et al. | 307/10.5 |
| 6,587,052 B1 * | 7/2003 | Flick | 340/825.69 |
| 7,164,363 B2 * | 1/2007 | Kubo et al. | 340/692 |
| 2001/0045896 A1 * | 11/2001 | Quinn | 340/815.4 |
| 2003/0086685 A1 * | 5/2003 | Bowden et al. | 386/46 |
| 2004/0145491 A1 * | 7/2004 | Nascimento | 340/825.72 |
| 2004/0183671 A1 * | 9/2004 | Long | 340/539.1 |
| 2005/0024346 A1 * | 2/2005 | Dupraz et al. | 345/179 |
| 2005/0099275 A1 * | 5/2005 | Kamdar et al. | 340/426.18 |
| 2005/0177370 A1 * | 8/2005 | Hwang et al. | 704/270 |
| 2005/0179542 A1 * | 8/2005 | Young | 340/539.32 |
| 2005/0276568 A1 * | 12/2005 | Korkis | 386/46 |
| 2007/0030121 A1 * | 2/2007 | Soliz | 340/5.72 |

OTHER PUBLICATIONS

Activeandable.com, 2 Channel Memo Recorder Publication, Internet Archive, Date: Mar. 17, 2005.*

* cited by examiner

Primary Examiner—Jeff Hofsass
Assistant Examiner—Kerri L McNally

(57) ABSTRACT

The invention relates to a 'Parking Location Reminder Device' with means to remind drivers of the location of their parked vehicle. It comprises of housing containing a microphone, speaker and voice recorder; and is constructed in a way such that it can be attached to a vehicle key chain. Drivers record the location of their parked vehicle recorder of the said device using microphone as the audio input means. The parking location of the said vehicle is retrieved by playing back the recorded voice message using speaker as the audio output means. Means is also provided in the said device to record and playback other voice memos. Means is also provided in the 'Parking Location Reminder Device' for drivers to record and display/playback still images and/or video of the location of their parked vehicles.

13 Claims, 3 Drawing Sheets

PARKING LOCATION REMINDER DEVICE

FIELD OF INVENTION

The present invention relates to a device with means to remind drivers of the location of their parked vehicle.

BACKGROUND & PRIOR ART

Drivers often forget the location where they had parked their vehicle. This is a frequent problem, especially in large multi storied parking garages. In this event, drivers have to either walk a long distance in the parking garage till they locate their vehicle; or they have to request the services of a parking attendant or a friend to drive them in the parking garage to locate their vehicle. Parking garages have come up with many innovative solutions to help drivers remember the location of their parked vehicle; 1) some have unique color schemes for each parking level; 2) some have easy to remember names for each parking level; 3) some have fliers at each level with the corresponding parking level printed on them that drivers can take with them; 4) some print their map and layout on the back of parking tickets, on which drivers can mark the location of their parked vehicle. However there are many drawbacks with each of the present methods used by parking garages; 1) there is no uniformity in the method used, with each parking garage having its own unique method; 2) most methods only help drivers remember the level on which their vehicle is parked and not its exact location; 3) most methods consume paper which is environmentally unfriendly; 4) the methods employing unique color schemes or unique names for each parking level still require driver to memorize them, which can be problematic, especially in case of older drivers and drivers who park their vehicles for longer periods of time; 5) some methods require drivers to write the location of their parked vehicle which can be a problem on many accounts; a) requires drivers to carry a writing instrument, which is not the case at all times; b) some elderly drivers have trouble writing because of poor vision, arthritis in their hand joints or neuromuscular disorders; c) sometimes lighting conditions in the parking garage is not optimal.

In addition, there are inventions in the prior art that have attempted to provide a suitable device with means to remind drivers of the location of their parked vehicle. In U.S. Pat. No. 6,529,142 issued on Mar. 4, 2003; Yeh et al have disclosed a system for locating a vehicle that is parked in a parking lot, a parking garage or on a street. The system comprises of two separate signal generator/processor circuits, each circuit being contained in a module, one being a hand-held locator module and the other, a receive/response module that is installed in a vehicle. Both modules, when activated by user, communicate with the other by means of specially encoded radio signals. To find a parked vehicle, a user merely presses a pushbutton on the locator module which transmits a high frequency search signal. In response, the receive/response module emits a direction indicating signal to the locator module, which then displays the direction and elevation of the vehicle with respect to the user location. Provision is made for the receive/response module to operate without a connection to a vehicle battery if necessary, allowing the module to be used portably. The system is small in size, inexpensive and easy to use.

In U.S. Pat. No. 6,489,921 issued on Dec. 2, 2002; Wilkinson has disclosed a system for locating a parked vehicle, as in the case of a driver having forgotten the location of his/her parked vehicle in a crowded parking lot, whereby a handheld apparatus is automatically engaged prior to the driver leaving the immediate vicinity of his/her parked vehicle. When thusly engaged, the apparatus retrieves GPS location coordinates for the parked vehicle from GPS satellites and stores these coordinates in its memory. Once activated by the driver for the purpose of finding his/her parked vehicle, the Vehicle Locating Apparatus retrieves GPS location coordinates for the driver's current position. Using the GPS location coordinates stored in its memory and those retrieved for the driver's current location, a microprocessor contained within the apparatus calculates the shortest course between the driver and his/her parked vehicle. This course is then presented on a visual display by way of a "floating" directional arrow. In the case of a parking garage where GPS satellite signals cannot be retrieved consistently, the apparatus has a built in counting switch that allows the driver to manually record in the apparatus' memory the floor number on which he/she parked his/her vehicle. When requested, the apparatus displays the floor number on a visual display.

In U.S. Pat. No. 6,400,358 issued on Jun. 4, 2002; Carter has disclosed a portable electronic parking location reminder device that may be easily carried on a key chain or key ring has an electronic display screen and contains a battery powered microcontroller with memory and timer features. User input keys on the housing allow the user to enter letters and/or numbers corresponding to the location of a parked vehicle, store the entered data, and later retrieve and display the data when it is desired to find the parked vehicle. The user input keys include a mode key for selecting between an alpha mode for entering letters of the alphabet (A-Z), a numeric mode for entering numerals (0-9), and a direction mode for entering letters representing geographical directions (N, NE, E, SE, S, SW, W,). Data is entered and displayed in several distinct fields that correspond to an aspect of the location of the parked vehicle. The identity of a parking lot in which the vehicle is parked may be entered in a first field, the identity of a row of a parking area entered in a second field, the identity of a floor level of a parking facility in a third field, and the identity of a geographical location of a parking area in a fourth field. Stored data may be selectively locked to prevent accidental changing. An automatic reduced power mode reduces power consumption when not in use, and a low battery condition is also displayed.

None of the inventions in the prior art however, has the unique construction, design and functionality of the 'Parking Location Reminder Device' of the present invention discussed here forth.

OBJECTS OF THE INVENTION

Accordingly the objects of the present invention is to provide a 'Parking Location Reminder Device' with means to remind drivers of the location of their parked vehicles which; 1) is cheap to produce; 2) is easy to construct; 3) is easy to operate; 4) has means to remind drivers of the location of their parked vehicle in all parking garages; 5) is environmentally friendly; 6) requires minimal manual dexterity on part of the driver; 7) is portable and easy to carry; and 8) does not require any additional accessories. A further object of the present invention is to provide a 'Parking Location Reminder Device' which, in addition to reminding drivers of the location of their parked vehicle, has means to remind them of other scheduled tasks. Yet another object of the invention is to provide a 'Parking Location Reminder Device' with means to take still images and/or video of the location of a parked vehicle.

SUMMARY OF THE INVENTION

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out one or several purposes of the present invention. It is important, therefore, that the claims be regarded as including such equivalent constructions insofar as they do not depart from the spirit and scope of the present invention.

The invention relates to a 'Parking Location Reminder Device' with means to remind drivers of the location of their parked vehicle. It comprises of housing which contains a microphone, speaker and voice recorder; and is constructed in a way such that it can be attached to a vehicle key chain. Drivers record the location of their parked vehicle into the voice recorder of the said device using the microphone as an input means. The parking location of the said vehicle can then be retrieved from the 'Parking Location Reminder Device' by playing back the recorded voice message using speaker as the output means. In another embodiment, means is provided in the said device to record and playback other voice memos. In yet another embodiment of the 'Parking Location Reminder Device' means is provided for drivers to record and display/playback still images and/or video of the location of their parked vehicles.

DETAILED DESCRIPTION OF THE DRAWINGS

Figure 1:
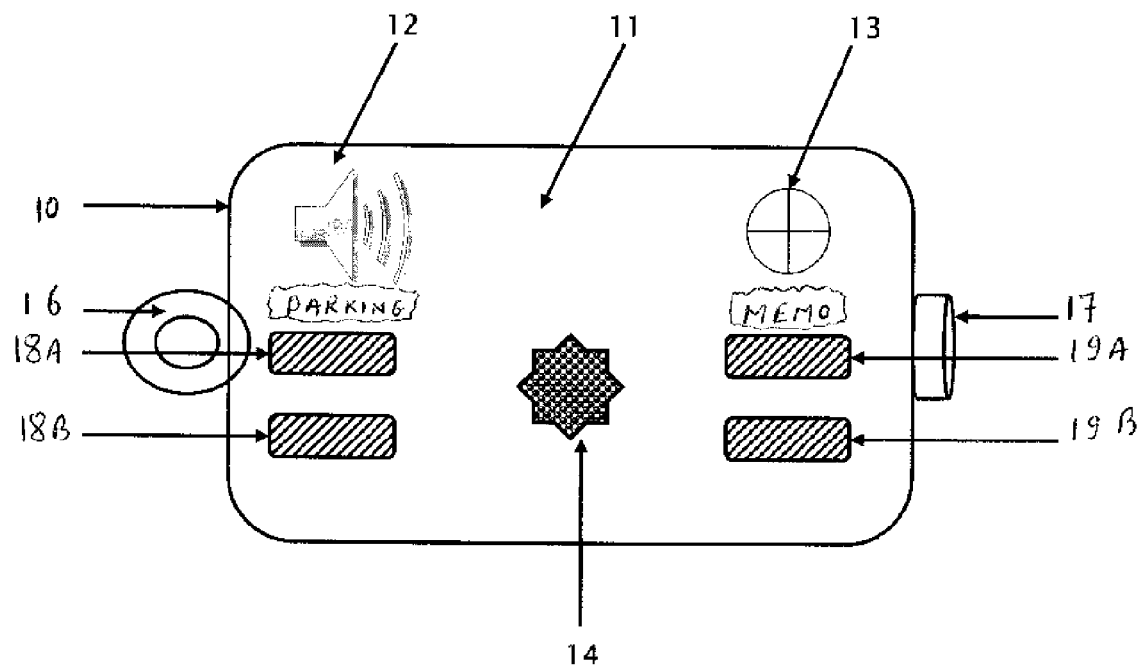
FIG. 1 shows an outside view of the first preferred embodiment of the 'Parking Location Reminder Device'.
Figure 2:
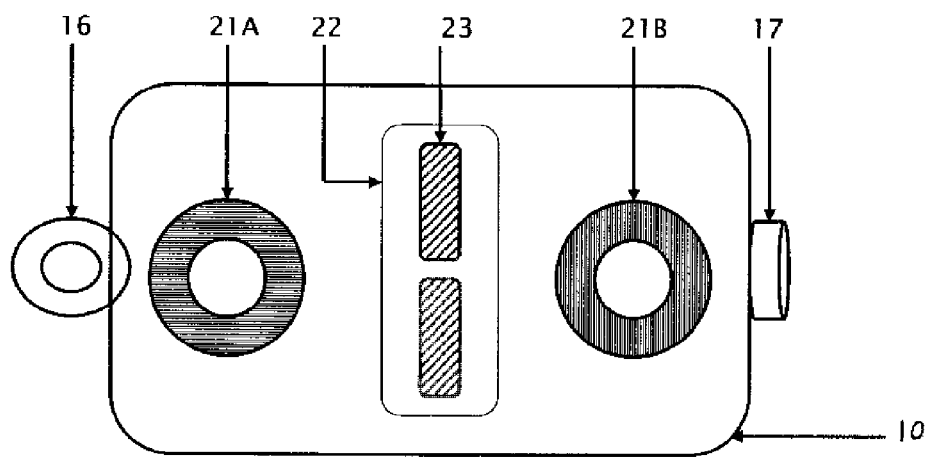
FIG. 2 shows an inside view of the first preferred embodiment of the 'Parking Location Reminder Device'.

FIGS. 1&2 show the construction of the first preferred embodiment of the 'Parking Location Reminder Device'. The 'Parking Location Reminder Device' (10) has a housing (11) which is rectangular in shape and is made of a durable and aesthetic material such as plastic or metal. The housing (11) contains a microphone (13), speaker (12) and a two recording tapes (21A&21B). Control switches, comprising of two recording switches (18A&19A) and two playback switches (18B&19B), are located on the housing (11). Control switches (18A&18B) control the operation of the parking location reminder feature and control switches (19A&19B) control the operation of the voice memo feature of the 'Parking Location Reminder Device' (10). A battery compartment (22) to accommodate batteries (23) is provided in the housing. The 'Parking Location Reminder Device' (10) has a ring (16) attached to it to provide means for drivers to attach the 'Parking Location Reminder Device' (10) to car key chain. An erase switch (14) is provided to erase voice messages recorded in the recording tapes (21A&21B). A security switch (17) is provided to prevent accidental deletion of the voice messages recorded in the recording tapes (21A&21B).

Figure 3:
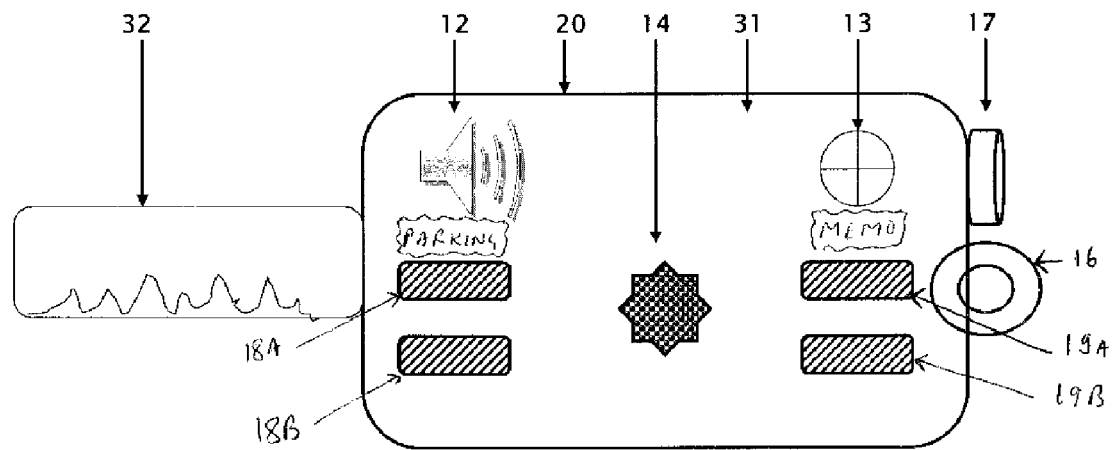
FIG. 3 shows the second preferred embodiment of the 'Parking Location Reminder Device'.

FIG. 3 shows the second preferred embodiment of the invention. The 'Parking Location Reminder Device' (20) is constructed at the base (31) of an ignition key (32). The 'Parking Location Reminder Device' (20) comprises of a housing containing a microphone (13), a speaker (12) and control switches. Two recording tapes are provided inside the housing (not shown). Control switches comprise of two recording switches (18A&19A) and two playback switches (18B&19B). Control switches (18A&18B) control the operation of the parking location reminder feature and control switches (19A&19B) control the operation of the memo feature of the 'Parking Location Reminder Device' (20). An erase switch (14) is provided to provide drivers means to erase voice recordings contained in the two recording tapes. A security switch (17) is provided to prevent accidental deletion of voice messages contained in the recording tapes. An advantage of this embodiment is that the 'Parking Location Reminder Device' (20) has means to draw power from a vehicle's batteries during the time when the ignition key (30) is engaged to the ignition switch, obviating the need for additional battery. This enables construction of a compact and more portable 'Parking Location Reminder Device' (20). A key ring (16) is provided to enable drivers to attach the 'Parking Location Reminder Device' (20) to a vehicle key chain.

Figure 4:
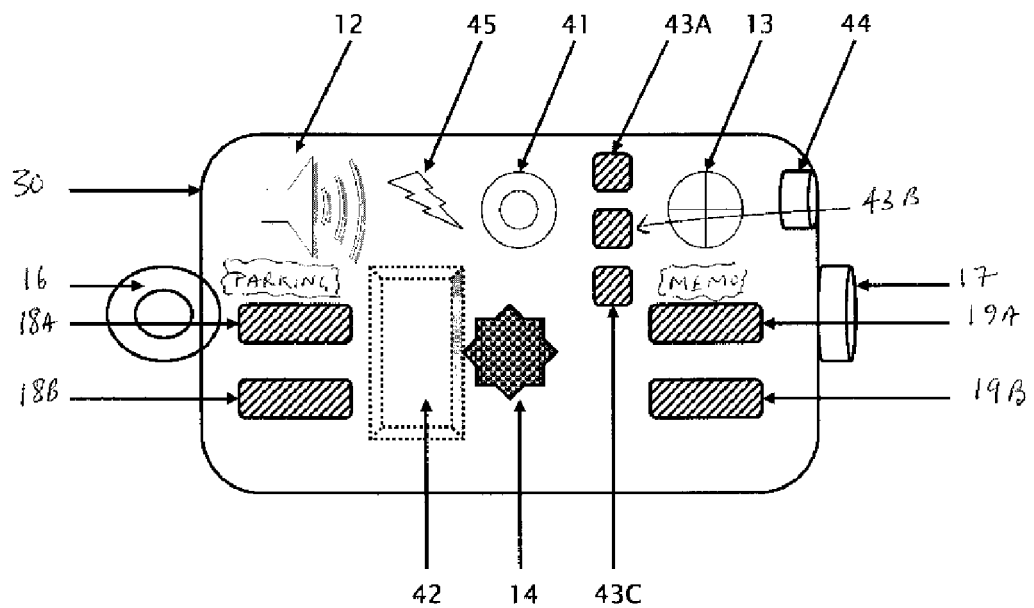
FIG. 4 shows front view of the third preferred embodiment of the 'Parking Location Reminder Device'.
Figure 5:
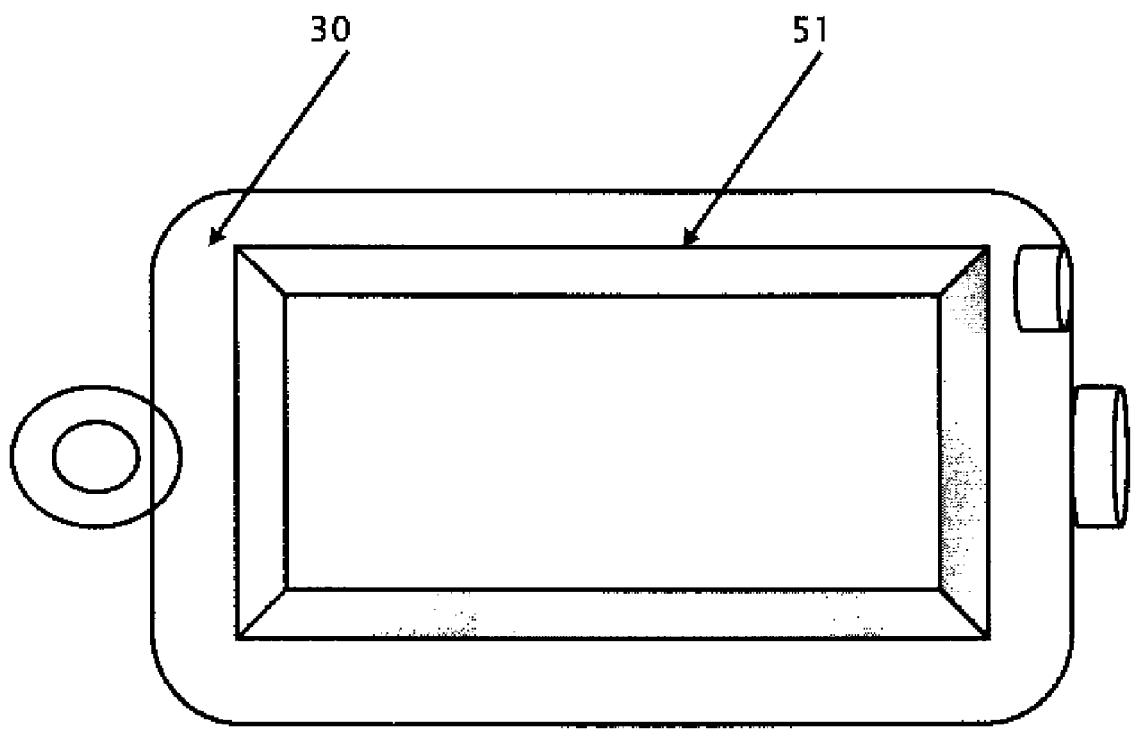
FIG. 5 shows rear view of the third preferred embodiment of the 'Parking Location Reminder Device'.

FIGS. 4&5 show the construction of the 'Parking Location Reminder Device' according to the third preferred embodiment of the invention. The 'Parking Location Reminder Device' (30), according to this embodiment, consists of a housing which is preferably made of a durable and aesthetic material such as plastic. The housing (11) contains a microphone (13), speaker (12) and an array of control switches. Control switches comprise of two recording switches (18A&19A) and two playback switches (18B&19B). Control switches (18A&18B) control the operation of the parking location reminder feature and control switches (19A&19B) control the operation of the memo feature of the 'Parking Location Reminder Device' (20). Three additional control switches (43A-43C) are provided to aid the operation of the digital camera (41). Control switch 43A is to capture a picture, control switch 43B is to view a picture and control switch 43C is to erase a picture. An erase control switch (14) is provided to provide drivers means to erase voice recordings contained in the audio recording tapes. A security switch (17) is provided to prevent accidental deletion of voice messages contained in the audio recording tapes. Two audio recording tapes (not shown) are provided inside the housing. A digital camera (41) and flash (45) are provided to enable driver take still images/record video of the location of their parked vehicle. Preferably a zoom in and zoom out feature is provided in the camera (41). A memory device (42) to store image/video is provided in the housing. Instead of an indwelling memory device (42), a removable device such as a memory stick can be used. The flash (45) helps drivers take pictures in dark environments. A display unit (51) is provided in the back of the 'Parking Location Reminder Device' (30) to provide means to view still images and video saved therein. A synchronizing port (44) is provided to enable upload of still images and video from the 'Parking Location Reminder Device' (30) to a personal computer or other electronic devices. The advantage of this embodiment of the 'Parking Location Reminder Device' (30) is that it provides drivers an additional means to remember the location of their parked vehicle. Drivers have means to take still images and/or video of the location of their parked vehicle, and of any landmarks in its vicinity, which may be helpful in reminding them of the location of their parked vehicle.

Operation of the 'Parking Location Reminder Device': The primary object of the 'Parking Location Reminder Device' of all preferred embodiments of the invention is to enable drivers record the location of their parked vehicle into the said device. Activation of the recording switch (18A) activates voice recording of the parking location of a vehicle. Driver's voice is recorded using the microphone (13) into the recording tape (21A). Preferably, recorded parking location information comprises of the ID of the parking spot, parking level, any identifiable landmarks in the vicinity of the said parking spot, directions to the said parking spot and any other pertinent information. The recorded parking location is played back by activating the playback switch (18B) and using the speaker as the audio output means. This provides an easy means for a driver to record and thereafter retrieve the parking location of his vehicle using a portable device that can easily be attached to and carried with a car key chain. The recorded parking location message in the 'Parking Location Reminder Device' can be erased manually by operation of the erase switch (14). To prevent accidental deletion, a security switch (17) is provided. Parking location information can not be erased from the 'Parking Location Reminder Device' until the said security switch (17) is manually disabled by the user. According to another method, means is provided in the 'Parking Location Reminder Device' to automatically erase parking location information recorded therein, when the 'Parking Location Reminder Device' is engaged with the ignition switch of a vehicle. This approach is more feasible with the second embodiment of the invention, as the 'Parking Location Reminder Device' (20) is constructed in unison with the base of the ignition key (31). This enables the 'Parking Location Reminder Device' (30) to receive electrical signal from the ignition switch, when the ignition key (32) is engaged to the ignition switch. Automatic deletion of the parking location from the 'Parking Location Reminder Device' (20) is a more practical approach; as once the driver is in his vehicle there is no further need to remember the parking location of the said vehicle.

An additional object of the invention is to provide means in the 'Parking Location Reminder Device' to record other voice memos. This provides drivers, means to remember not only the location of their parked vehicle, but also remember other tasks and reminders in one compact, portable and easy to carry device. It is especially useful to have this feature in a device that can be attached to car key ring; as it enables a driver to review his/her voice memos at all times, especially when he/she is out driving. This feature, for example, can be useful to a driver to make a note of a grocery item to be purchased on his/her way back from office. In the preferred embodiments of the invention, voice memos are recorded into the audio recording tape (21B) by activating the recording control switch (19A) and using the microphone (13) as the audio input means. The preferred embodiments have two separate audio recording tapes each (21A&21B), one (21A) to record parking location information and the other (21B) to record voice memos. However, a single audio recording tape can be partitioned to record both parking location and voice memos. The recorded voice memo can be played back by activating the playback control switch (19B) and using the speaker as the audio output means. Preferably, means is provided to playback voice memos automatically at pre determined intervals, especially when the ignition key is engaged (this feature is particularly applicable to the 'parking location reminder device' (20) of the second preferred embodiment). This will enable drivers remember tasks more efficiently. Recorded voice memos can be erased manually by activating the erase switch (14). To prevent accidental deletion of the recorded voice memos, a security switch (17) is provided. In order to erase a voice memo, the security switch (17) has to be disabled prior to activation of the erase switch (14).

According to another aspect of the invention, means is provided to record still image and/or video of the location of a parked vehicle. This is best accomplished in the third preferred embodiment of the invention (30). Still images and/or video of the parking location is recorded by activating the image/video recording switch (43A) and using the camera (41). The flash (45) is used to assist in recording of the still images and/or video in sub optimally lit environments. The still image/video are recorded in the memory device (42). The recorded still images/video is displayed on the display screen (51) upon activation of the display control switch (43B). Preferably, recording of the parking location of a vehicle contains recording of the parking spot, surrounding area and any other near by landmarks that may assist a driver locate his/her parked vehicle easily. The recorded still images and/or video can be uploaded into a personal computer or other similar devices using the synchronization port (44). Still images and/or video recorded in the memory device (42) can be erased using the erase switch (43C). A security switch (17) is provided to prevent accidental deletion of the recorded images/video from the memory device (42). The security switch (17) has to be disabled prior to erasing recorded images/video from the memory device (42).

The invention is capable of other embodiments and of being practiced and carried out in various ways. As such, those skilled in the art will appreciate that the conception, upon which this disclosure is based, may readily be utilized as a basis for the designing of other structures, methods and systems for carrying out one or several purposes of the present invention. It is important, therefore, that the claims be regarded as including such equivalent constructions insofar as they do not depart from the spirit and scope of the present invention. Some variations of the present inventions are: 1) the recording tapes mentioned in the preferred embodiments can be magnetic or digital; 2) the various control mechanisms for operation of the 'parking location reminder device' can be voice activated; 3) means can be provided to transmit the voice, picture and video recorded in the parking location reminder device to other remote devices such as cellular phone. This list is only illustrative and by no means all inclusive.

What is claimed is:

1. A device integrated with automobile ignition key comprising; 1) audio input means; 2) audio recording device; 3) audio output means; 4) means to record voice memo; and 5) means to erase voice memo in response to signal input from ignition switch.

2. The device of claim 1; wherein audio input means is a microphone.

3. The device of claim 1; wherein audio output means is a speaker.

4. The device of claim 1; wherein means is provided to draw power into the device from vehicle's batteries via the ignition switch of the vehicle.

5. A device integrated with automobile ignition key comprising; 1) audio input means; 2) a first audio recording device; 3) a second audio recording device; 3) audio output means; 4) means to record voice memo in audio recording device; and 5) means to erase voice memo in at least one audio recording device in response to signal input upon engine ignition.

6. The device of claim 5; wherein audio input means is a microphone.

7. The device of claim 5; wherein audio output means is a speaker.

8. The device of claim 5; wherein means is provided to automatically playback voice recordings, containing one or more voice memos at pre determined intervals.

9. The device of claim 5; wherein means is provided to draw power into the device from vehicle's batteries via the ignition switch of the vehicle.

10. A device integrated with automobile ignition key comprising; 1) audio input means; 2) audio recording device; 3) audio output means, 4) image/video recording means; 5) means to record memo; and 6) means to automatically erase memo in response to signal input upon insertion of the ignition key into ignition switch.

11. The device of claim 10; wherein image/video recording means is a camera.

12. The device of claim 10; wherein means is provided to display image/video.

13. The device of claim 10; wherein audio input means is a microphone.

* * * * *